United States Patent [19]

Herold

[11] Patent Number: 5,245,342

[45] Date of Patent: Sep. 14, 1993

[54] ANALOG TO DIGITAL CONVERTER INCORPORATING SUMMING CURRENTS RESPONSIVE TO A DIGITAL OUTPUT THEREOF

[75] Inventor: Barry W. Herold, Boca Raton, Fla.

[73] Assignee: Motorola, Inc., Schaumburg, Ill.

[21] Appl. No.: 867,658

[22] Filed: Apr. 13, 1992

[51] Int. Cl.[5] .............................................. H03M 1/44
[52] U.S. Cl. ................................... 341/133; 341/136; 341/161
[58] Field of Search ............... 341/133, 134, 135, 136, 341/161, 162, 163, 153, 155

[56] References Cited

U.S. PATENT DOCUMENTS 4,225,854 9/1980 Davis et al. ........................ 341/134
4,305,064 12/1981 Davis ................................. 341/134
4,379,285 4/1983 Dooley ............................... 341/135

Primary Examiner—Howard L. Williams
Attorney, Agent, or Firm—Robert L. Breeden; William E. Koch; Thomas G. Berry

[57] ABSTRACT

An analog to digital converter (200, 300, 400) comprises a sink current circuit (200, 438, 440, 442) responsive to an input voltage for generating at least two sink currents. A source current circuit (300, 404, 406, 408, 418, 420, 422, 456, 458, 460) for generating at least three weighted source currents is coupled to the sink current circuit at summing nodes (424, 426, 428) in order to produce at least two digital output signals (D0, D1, D2). A switching circuit (444, 446, 448) is coupled to the source current circuit for enabling selected source currents in response to the digital output signals.

23 Claims, 2 Drawing Sheets

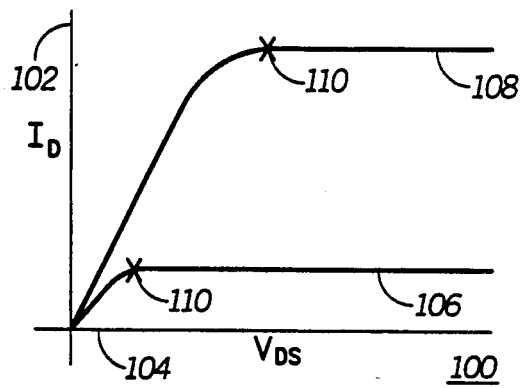
FIG.1 — PRIOR ART —
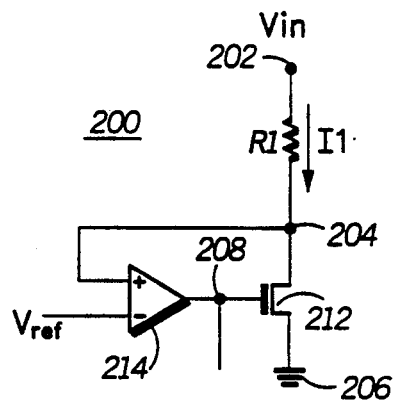
FIG.2
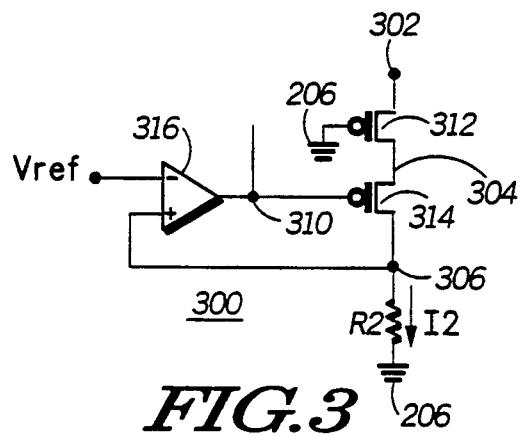
FIG.3
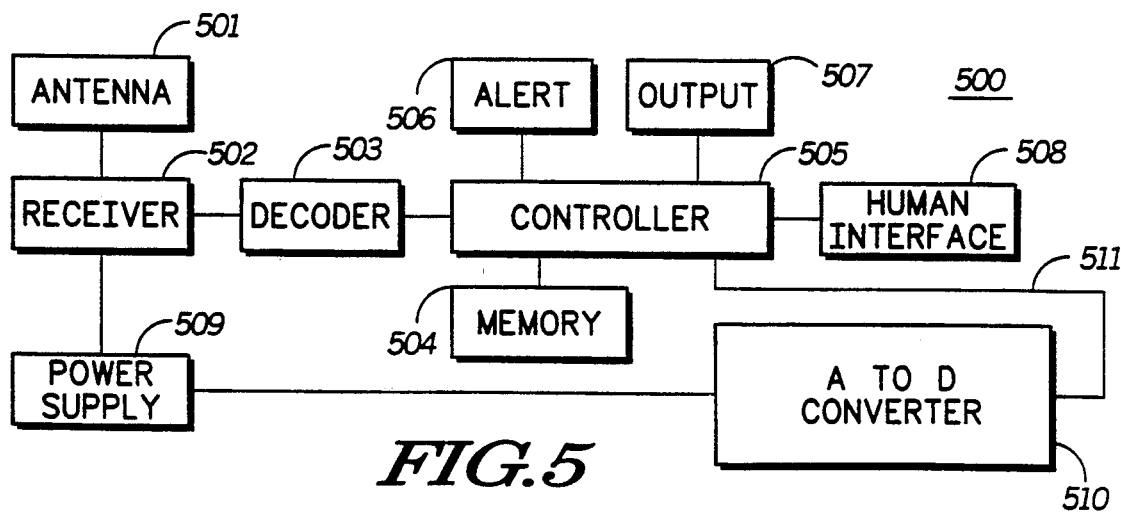
FIG.5

ANALOG TO DIGITAL CONVERTER INCORPORATING SUMMING CURRENTS RESPONSIVE TO A DIGITAL OUTPUT THEREOF

FIELD OF THE INVENTION

This invention relates in general to logic circuits, and more specifically to analog to digital converters.

BACKGROUND OF THE INVENTION

Conventional analog to digital (A to D) converter circuits are well known to those skilled in logic circuit design. Such conventional A to D circuits typically comprise an analog input comparator coupled to an up/down counter driven by a high speed tracking clock. A digital output from the counter, representing the count value contained in the up/down counter, is coupled to a digital to analog (D to A) converter for translation of the digital count value to an analog voltage level. The analog output of the D to A converter is typically coupled back to the analog input comparator for comparison with an analog input signal.

In typical operation, when the input comparator has an input voltage present at its input, if the input voltage is higher than the analog output voltage being sent to the input comparator by the D to A converter, then the output of the comparator causes the tracking clock to increment the up/down counter so as to increase its count value. The increasing count value results in an increasing analog output voltage level from the D to A converter. When the output of the D to A converter has reached a level equal to that of the input voltage, the input comparator stops the up/down counter.

Conversely, if the input voltage level falls below that being sent to the input comparator by the D to A converter, then the output of the comparator causes the tracking clock to decrement the up/down counter so as to decrease its count value. The decreasing count value results in a decreasing analog output voltage level from the D to A converter. When the output of the D to A converter again has reached a level equal to that of the input voltage, the input comparator stops the up/down counter. Whenever the circuit has reached equilibrium, and the comparator has substantially stopped incrementing or decrementing the counter, the digital output of the counter represents a value corresponding to the analog value of the input voltage. It is the digital output of the counter, therefore, that is used as the digital output of the conventional A to D converter just described.

In order to respond rapidly to changes in the input voltage level, the tracking clock frequency must be chosen such that the up/down counter will reach the equilibrium value as quickly as necessary to track the fastest transition of the input voltage. This requirement implies that the tracking clock frequency must be several times the highest frequency of interest in making the A to D conversion of the input voltage. Because it is often necessary to monitor very fast transitions of the input voltage level, a high frequency tracking clock also is often necessary, as is a high speed up/down counter that can operate at the high frequency of the tracking clock.

A disadvantage of the conventional A to D converter circuit is that the high frequency tracking clock and high speed counter can produce both conducted and radiated electromagnetic noise that can interfere with other circuitry within the system in which the A to D converter is used. In many cases, additional components or costly redesign passes may be required to prevent this noise from disturbing sensitive circuits. A further disadvantage is that the high speed counter can require significant power to operate. This is particularly disadvantageous when the A to D converter is used in a battery powered application such as a portable selective call receiver.

SUMMARY OF THE INVENTION

One aspect of the present invention is an analog to digital converter comprising first and second supply voltage nodes, and a first current generator coupled to the second supply voltage node and responsive to an input voltage for generating at least two first currents. The analog to digital converter further comprises a second current generator coupled to the first supply voltage node for generating at least three second currents. The second current generator comprises at least two primary current generators for generating at least two primary currents having weighted incremental current levels, and at least one current correction generator for generating at least one correction current having a weighted incremental current level. The analog to digital converter further comprises a summing element coupled to the first and second current generators for summing each of the at least two first currents with at least one of the second currents in order to produce at least two digital output signals. The analog to digital converter further comprises a switching element, coupled between the first supply voltage node and the at least one current correction generator, for selectively enabling the at least one correction current in response to the digital output signals.

Another aspect of the present invention is a method of performing an analog to digital conversion comprising the steps of generating at least two first currents responsive to an input voltage, and generating at least three second currents having weighted incremental current levels. The method further comprises the steps of summing each of the first currents with selected second currents in order to produce at least two digital output signals, and enabling selected second currents in response to the digital output signals.

Another aspect of the present invention is a selective call receiver comprising a power supply for providing power to the selective call receiver, and a receiver element coupled to the power supply for receiving radio frequency signals comprising information. The selective call receiver further comprises a controller, coupled to the receiver element for controlling the selective call receiver and processing and presenting the information. The controller includes at least one analog to digital converter. The analog to digital converter comprises first and second supply voltage nodes coupled to the power supply, and a first current generator coupled to the second supply voltage node and responsive to an analog voltage generated within at least one of the power supply, the receiver element, and the controller, for generating at least two first currents. The analog to digital converter further comprises a second current generator coupled to the first supply voltage node for generating at least three second currents. The second current generator comprises at least two primary current generators for generating at least two primary currents having weighted incremental current levels, and at least one current correction generator for generating at least one correction current having a weighted incremental current level. The analog to digital converter further comprises a summing element coupled to the first and second current generators for summing each of the at least two first currents with at least one of the second currents in order to produce at least two digital output signals for determining the status of the analog voltage generated. The analog to digital converter further comprises a switching element, coupled between the first supply voltage node and the at least one current correction generator, for selectively enabling the at least one correction current in response to the digital output signals.

BRIEF DESCRIPTION OF THE DRAWINGS

FIG. 1 is a graph showing the output characteristics of a typical MOS transistor used in accordance with an embodiment of the present invention.

FIG. 2 is a schematic diagram of a sink bias generating circuit in accordance with a preferred embodiment of the present invention.

FIG. 3 is a schematic diagram of a source bias generating circuit in accordance with a preferred embodiment of the present invention.

FIG. 5 is a block diagram of a selective call receiver in accordance with a preferred embodiment of the present invention.

DESCRIPTION OF A PREFERRED EMBODIMENT

Figure 4:
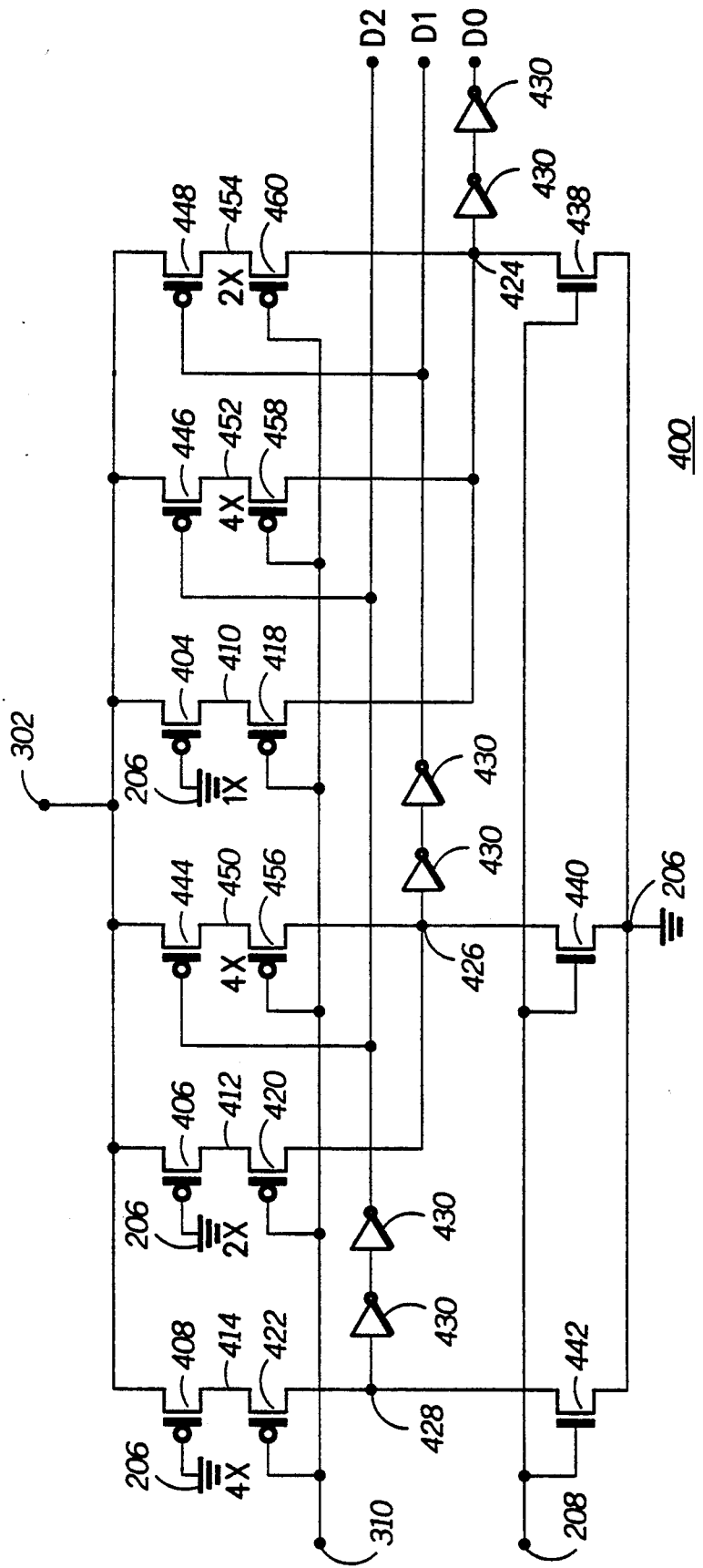
FIG. 4 is a schematic diagram of an analog to digital converter circuit in accordance with a preferred embodiment of the present invention.

With reference to FIG. 1, on a graph 100 the vertical scale 102 indicates the level of current flowing through the drain electrode, while the horizontal scale represents the level of voltage between the drain electrode and the source electrode. Two output characteristics curves are shown, one for a small control electrode to source electrode voltage 106 and another for a larger control electrode to source voltage 108. On either output characteristics curve as the drain to source voltage increases from zero to a value corresponding to the knee 110 of the curve, the drain current also increases in a reasonably linear fashion until the knee 110 is approached. As the drain to source voltage increases further beyond the knee 110 of either curve, the drain current remains substantially constant. Of further interest is the fact that the maximum drain current that can be sustained may be controlled by adjusting the control electrode to source voltage to an appropriate value. These characteristics make MOS transistors excellent components for use in circuits designed to either sink or source currents of predetermined maximum amounts.

With reference to FIG. 2, a sink bias generating circuit 200 comprises a resistor R1 coupled between an input voltage node 202 and an intermediate node 204. An NMOS sink bias transistor 212 is coupled between the intermediate node 204 and a supply voltage node 206 and has a control electrode coupled to a sink bias output node 208. An operational amplifier 214 has a non-inverting input coupled to the intermediate node 204, an inverting input coupled to voltage reference Vref, and an output coupled to the sink bias output node 208.

In operation, when input voltage Vin is applied to the input voltage node 202, a sink current I1 will flow such that $$I1 = \frac{Vin - Vref}{R1}.$$

Modeling Vin as an incremental voltage $\Delta V$ over Vref, the sink current I1 becomes $$I1 = \frac{\Delta V}{R1}.$$

Provided that Vref has been chosen large enough for the drain to source voltage of the sink bias transistor 212 to be greater than the voltage at the knee 110 of the MOS output characteristics curve corresponding to the current I1, any other NMOS transistor similar to the sink bias transistor 212 and biased from the sink bias output node 208 will sink a maximum current equal to I1.

With reference to FIG. 3, a source bias generating circuit 300 comprises a PMOS source bias balancing transistor 312 coupled between a supply voltage node 302 and an intermediate node 304 and having a control electrode coupled to the supply voltage node 206. A PMOS source bias controlling transistor 314 is coupled between the intermediate node 304 and an intermediate node 306 and has a control electrode coupled to a source bias output node 310. A resistor R2 is coupled between the intermediate node 306 and the supply voltage node 206. An operational amplifier 316 has a non-inverting input coupled to the intermediate node 306 and has an inverting input coupled to the voltage reference Vref. The output of the operational amplifier 316 is coupled to the source bias output node 310.

In operation, a source current I2 will flow such that $$I2 = \frac{Vref}{R2}.$$

Provided that Vref has been chosen large enough for the drain to source voltage of source bias controlling transistor 314 to be greater than the voltage at the knee 110 of the MOS output characteristics curve corresponding to the current I2, any other PMOS transistor similar to the source bias controlling transistor 314 and biased from the source bias output node 310 will source a maximum current equal to I2.

From the preceding equations, the ratio of the sink current I1 to the source current I2 is $$\frac{R2}{R1} \times \frac{\Delta V}{Vref}.$$

Certain values of $\Delta V$ will cause this ratio to have an integer value K, where K=1, 2, 3, etc. When the ratio of the sink current I1 to the source current I2 is an integer value K, then it follows that $$\Delta V = \frac{R1}{R2} \times Vref \times K.$$

In other words, for each integer increase in the ratio of the sink current I1 to the source current I2, $\Delta V$ increases by a factor of $$\frac{R1}{R2} \times Vref.$$

With reference to FIG. 4, an A to D converter main circuit 400 is a three-bit converter comprising three PMOS source balancing transistors 404, 406, and 408 each uniquely coupled between balancing nodes 410, 412, and 414, respectively, and the supply voltage node 302. Control electrodes of the source balancing transistors 404, 406, and 408 are coupled to the supply voltage node 206. Three PMOS sourcing transistors 418, 420, and 422 are uniquely coupled between the balancing nodes 410, 412, and 414 and summing nodes 424, 426, and 428, respectively. Control electrodes of the sourcing transistors 418, 420, and 422 are coupled to the source bias output node 310. The summing nodes 424, 426, and 428 are coupled by six buffer circuits 430 to digital output nodes D0, D1, and D2, respectively. Three NMOS sinking transistors 438, 440, and 442 are uniquely coupled between the summing nodes 424, 426, and 428, respectively, and the supply voltage node 206. Control electrodes of the sinking transistors 438, 440, and 442 are coupled to the sink bias output node 208. Three PMOS source correction switching transistors 444, 446, and 448 are uniquely coupled between the switching nodes 450, 452, and 454, respectively, and the supply voltage node 302. Control electrodes of the source correction switching transistors 444 and 446 are coupled to the digital output node D2, while a control electrode of the source correction switching transistor 448 is coupled to the digital output node D1. A PMOS source correction transistor 456 is coupled between the switching node 450 and the summing node 426, and has a control electrode coupled to the source bias output node 310. Two PMOS source correction transistors 458 and 460 are uniquely coupled between the switching nodes 452 and 454, respectively, and the summing node 424, and have control electrodes coupled to the source bias output node 310.

The design of the A to D converter 400 is such that each of the sinking transistors 438, 440, and 442 has the same predetermined transconductance characteristics as that of the sink bias transistor 212. This implies that, given the same control electrode to source bias voltage from the sink bias output node 208, the sinking transistors 438, 440, and 442 will each be able to sink the same sink current $$I1 = \frac{\Delta V}{R1}$$

as the sink bias transistor 212.

The sourcing transistor 418 and the source balancing transistor 404 also have the same predetermined transconductance characteristics as those of their counterparts in the source bias generating circuit 300, i.e., the source bias controlling transistor 314 and the source bias balancing transistor 312, respectively. This implies that, given the same control electrode to source bias voltage from the source bias output node 310, the sourcing transistor 418 and the source balancing transistor 404 in combination will be able to source the same source current $$I2 = \frac{Vref}{R2}$$

as the source bias generating circuit 300.

The design parameters of the sourcing transistor 420 and the source balancing transistor 406 provide for double the predetermined transconductance compared to that of their counterparts in the source bias generating circuit 300. This implies that, given the same control electrode to source bias voltage from the source bias output node 310, the sourcing transistor 420 and the source balancing transistor 406 in combination will be able to source twice as much current as the source bias generating circuit 300. The same double current design parameters apply to the source correction transistor 460 and the source correction switching transistor 448.

The design parameters of the sourcing transistor 422 and the source balancing transistor 408 provide for four times the predetermined transconductance compared to that of their counterparts in the source bias generating circuit 300. This implies that, given the same control electrode to source bias voltage from the source bias output node 310, the sourcing transistor 422 and the source balancing transistor 408 in combination will be able to source four times as much current as the source bias generating circuit 300. The same quadruple current design parameters apply to the source correction transistors 456 and 458, and the source correction switching transistor 444 and 446.

In operation, when $\Delta V$ is zero, the maximum sink current I1 that the sinking transistors 438, 440, and 442 can sink is also zero. The summing nodes 424, 426, and 428 thus all will be pulled high by their respective sourcing transistors 418, 420, and 422 and source balancing transistors 404, 406, and 408. All digital output nodes D0, D1, and D2 therefore also will be high, thus disabling the source correction switching transistors 444, 446, and 448.

As $\Delta V$ increases to a level equal to $$\frac{R1}{R2} \times Vref,$$

the sink current I1 increases to a level equal to the source current I2 flowing in the source bias generating circuit 300, and equal to the maximum current that can be sourced by the sourcing transistor 418 and the source balancing transistor 404. As $\Delta V$ increases slightly further, the summing node 424 and the digital output node D0 fall low, indicating a least significant bit transition.

As $\Delta V$ increases to a level equal to double $$\frac{R1}{R2} \times Vref,$$

the sink current I1 increases to a level equal to twice the source current I2 flowing in the source bias generating circuit 300, and equal to the maximum current that can be sourced by the sourcing transistor 420 and the source balancing transistor 406. As $\Delta V$ increases slightly further, the summing node 426 and the digital output node D1 fall low. As the digital output node D1 falls low, the source correction switching transistor 448 is enabled, allowing the source correction transistor 460 to source an additional current of up to twice I2, for a total current sourcing capacity of three times I2 deliverable to the summing node 424. This additional current sourcing capacity forces the summing node 424 and the digital output node D0 to return to a high level until $\Delta V$ increases to a level slightly greater than three times $$\frac{R1}{R2} \times Vref,$$

at which time the summing node 424 and the digital output node D0 will again fall low.

As ΔV increases to a level equal to four times $$\frac{R1}{R2} \times Vref,$$

the sink current I1 increases to a level equal to four times the source current I2 flowing in the source bias generating circuit 300, and equal to the maximum current that can be sourced by the sourcing transistor 422 and the source balancing transistor 408. As ΔV increases slightly further, the summing node 428 and the digital output node D2 fall low. As the digital output node D2 falls low, the source correction switching transistors 444 and 446 are enabled, allowing the source correction transistors 456 and 458 to source an additional current of up to four times I2 to the summing nodes 424 and 426, returning these nodes and the digital output nodes D0 and D1 to high levels. As the digital output node D1 goes high, the source correction switching transistor 448 again is disabled, bringing the total current sourced to the summing node 424 to exactly five times I2.

As ΔV increases further from just above four to just above seven times $$\frac{R1}{R2} \times Vref,$$

the summing node 428 and the digital output node D2 will remain low. The summing nodes 424 and 426 and the digital output nodes D0 and D1 all will operate the same as just described for ΔV increasing from zero to just above three times $$\frac{R1}{R2} \times Vref,$$

thus completing all combinations of output possible in a three-bit A to D converter.

As described thus far, the input voltage for operating the A to D converter 400 has no offset from Vref. That is, each increment of ΔV equal to $$\frac{R1}{R2} \times Vref$$

beginning at Vref will increment the output of the A to D converter 400. If an offset is desired such that increments of ΔV equal to $$\frac{R1}{R2} \times Vref$$

start incrementing the A to D converter 400 at a voltage somewhat higher than Vref, the offset may be accomplished as follows. As described previously, the sourcing transistors 418, 420, and 422 and the source balancing transistors 404, 406, and 408 are designed with predetermined transconductances to source I2, 2×I2, and 4×I2 source currents, respectively, where $$I2 = \frac{Vref}{R2}.$$

By modifying the predetermined transconductance to cause these transistors to source I2+I3, (2×I2)+I3, and (4×I2)+I3, it is possible to offset the voltage at which the A to D converter 400 begins to increment. For example, to give the A to D converter 400 an offset equal to N times the ΔV required to increment the digital output by one count, I3 must equal $$N \times \frac{Vref}{R2},$$

where N may assume both integer and non-integer values.

The advantages of the A to D converter 400 in accordance with an embodiment of the present invention over conventional A to D converters are as follows. The elimination of the high frequency tracking clock and high speed counter previously required in conventional A to D converters eliminates the associated electromagnetic noise that can interfere with other circuitry within the system in which the A to D converter is used. The elimination of the high frequency tracking clock and high speed counter also reduces the amount of power consumed by the A to D converter. Low power consumption is particularly advantageous when the A to D converter is used in a battery powered application such as a portable selective call receiver. Another advantage is that the A to D converter 400 in accordance with an embodiment of the present invention can be built using less fabricated silicon than that required by a conventional A to D converter. This is because the A to D converter 400 uses fewer transistors than a conventional converter requiring the high frequency clock and counter.

In a preferred embodiment of the A to D converter circuit 200, 300, and 400, the voltages Vref, Vin, and a voltage applied to the supply voltage node 302 all are implied to be positive with respect to the potential of the supply voltage node 206. It will be apparent to those skilled in the art that an alternate embodiment of the A to D converter circuit 200, 300, and 400 can be realized by reversing the polarities of the voltages Vref, Vin, and the voltage applied to the supply voltage node 302; and substituting P-channel transistors for all N-channel transistors of the preferred embodiment, and substituting N-channel transistors for all P-channel transistors of the preferred embodiment. In the case of the alternate embodiment, all the current sources and current source biasing circuits thus would become current sinks and current sink biasing circuits, while all the current sinks and current sink biasing circuits thus would become current sources and current source biasing circuits.

With reference to FIG. 5, a selective call receiver 500 comprises an antenna 501 for receiving signals coupled to a receiver circuit 502 that demodulates the signals received. A decoder 503 is coupled to the receiver circuit 502 for decoding received information. A controller 505 is coupled to the decoder 503 for receiving and processing the information. A memory 504 is coupled to the controller 505 for storing those messages containing the address of the selective call receiver as determined by the controller 505. The controller 505 also controls the storing and recalling of those messages. An alert device 506 provides an alert, e.g., audible or tactile, to the user that a message has been received and is ready to be presented. An output device 507 may be a visual display or a speaker controlled by the controller 505. A human interface 508 allows the user to command the controller 505 to perform the selective call receiver operations well known to those skilled in the art and typically includes control switches such as an on/off control button, a function control, etc. A power supply 509 provides power to all circuits of the selective call receiver. An a to D converter circuit 510 according to the present invention monitors selected analog voltages in the selective call receiver 500 and provides to the controller 505 a digital output 511 representing the status of the monitored analog voltages. The monitored analog voltages comprise, for example, a primary battery voltage in the power supply 509, a voltage indicative of received signal strength in the receiver circuit 502, a voltage controlling visual display contrast in the output device 507, and an output voltage from a voltage regulator circuit in the power supply 509.

What is claimed is:

1. An analog to digital converter comprising:
   a first supply voltage node;
   a second supply voltage node;
   first current generating means coupled to the second supply voltage node and responsive to an input voltage for generating at least two first currents;
   second current generating means coupled to the first supply voltage node for generating at least three second currents, the second current generating means comprising:
   at least two primary current generators for generating at least two primary currents having weighted incremental current levels; and
   at least one current correction generator for generating at least one correction current having a weighted incremental current level;
   summing means coupled to the first and second current generating means for summing each of the at least two first currents with at least one of the second currents in order to produce at least two digital output signals; and
   switching means, coupled between the first supply voltage node and the at least one current correction generator, for selectively enabling the at least one correction current in response to the digital output signals.

2. The analog to digital converter according to claim 1, wherein the first current generating means comprises:
   a first bias generating circuit responsive to the input voltage for generating a first bias voltage; and
   a first current generating circuit, coupled to the first bias generating circuit and responsive to the first bias voltage, for generating the at least two first currents.

3. The analog to digital converter according to claim 2, wherein the first bias generating circuit comprises:
   a resistor coupled between an input voltage node and an intermediate node;
   a bias transistor coupled between the intermediate node and the second supply voltage node and having a control electrode coupled to a first bias output node; and
   an operational amplifier having a non-inverting input coupled to the intermediate node, having an inverting input coupled to a voltage reference, and having an output coupled to the first bias output node.

4. The analog to digital converter according to claim 3, wherein the first current generating circuit comprises at least two current generating transistors, each coupled between a corresponding one of at least two summing nodes and the second supply voltage node, each transistor having a control electrode coupled to the first bias output node.

5. The analog to digital converter according to claim 4,
   wherein the second current generating means further comprises a second bias generating circuit for generating a second bias voltage, and
   wherein the at least two primary current generators and the at least one current correction generator are coupled to the second bias generating circuit and responsive to the second bias voltage, for generating the at least three second currents.

6. The analog to digital converter according to claim 5, wherein the second bias generating circuit comprises:
   a bias balancing transistor coupled between the first supply voltage node and a first intermediate node and having a control electrode coupled to the second supply voltage node;
   a bias controlling transistor coupled between the first intermediate node and a second intermediate node and having a control electrode coupled to a second bias output node;
   a resistor coupled between the second intermediate node and the second supply voltage node; and
   an operational amplifier having a non-inverting input coupled to the second intermediate node, having an inverting input coupled to a voltage reference, and having an output coupled to the second bias output node.

7. The analog to digital converter according to claim 6,
   wherein one of the at least two primary current generators comprises:
   a current generating transistor, having control electrode coupled to the second bias output node, the current generating transistor being coupled between one of at least two balancing nodes and one of the at least two summing nodes, and the at least two summing nodes being coupled to at least two corresponding digital output nodes; and
   a current balancing transistor, coupled between one of the at least two balancing nodes and the first supply voltage node, and having control electrode coupled to the second supply voltage node, and
   wherein the at least one current correction generator comprises a current correction transistor, coupled between one of the at least two summing nodes and a switching node for the at least one current correction transistor, and having a control electrode coupled to the second bias output node.

8. The analog to digital converter according to claim 7, wherein the switching means comprises at least one current correction switching transistor coupled between the switching node for the at least one current correction transistor and the first supply voltage node, and having a control electrode coupled to one of the at least two digital output nodes.

9. The analog to digital converter according to claim 8, wherein the current generating transistor, the current balancing transistor, the current correction transistor, and the at least one current correction switching transistor, comprise a predetermined transconductance that determines the weighted incremental current levels for the summing nodes.

10. The analog to digital converter according to claim 9, wherein the current generating transistor, the current balancing transistor, the current correction transistor, and the at least one current correction switching transistor, comprise a length and width of fabricated silicon, the length of which determines the transconductance thereof.

11. A method of performing an analog to digital conversion comprising the steps of:
generating at least two first currents responsive to an input voltage;
generating at least three second currents having weighted incremental current levels;
summing each of the first currents with selected second currents in order to produce at least two digital output signals; and
enabling selected second currents in response to the digital output signals.

12. The method according to claim 11, wherein the step of generating at least two first currents comprises:
generating a first bias voltage responsive to the input voltage; and
generating at least two currents responsive to the first bias voltage.

13. The method according to claim 12, wherein the step of generating at least three second currents comprises:
generating a second bias voltage responsive to a reference voltage; and
generating at least three weighted currents responsive to the second bias voltage.

14. A selective call receiver comprising:
power supply means for providing power to the selective call receiver;
receiver means coupled to the power supply means for receiving radio frequency signals comprising information; and
controller means, coupled to the receiver means for controlling the selective call receiver and processing and presenting the information, including at least one analog to digital converter comprising:
a first supply voltage node coupled to the power supply means;
a second supply voltage node coupled to the power supply means;
first current generating means coupled to the second supply voltage node and responsive to an analog voltage generated within at least one of the power supply means, the receiver means, and the controller means, for generating at least two first currents;
second current generating means coupled to the first supply voltage node for generating at least three second currents, the second current generating means comprising:
at least two primary current generators for generating at least two primary currents having weighted incremental current levels; and
at least one current correction generator for generating at least one correction current having a weighted incremental current level;
summing means coupled to the first and second current generating means for summing each of the at least two first currents with at least one of the second currents in order to produce at least two digital output signals for determining the status of the analog voltage generated; and
switching means, coupled between the first supply voltage node and the at least one current correction generator, for selectively enabling the at least one correction current in response to the digital output signals.

15. The selective call receiver according to claim 14, wherein the first current generating means comprises:
a first bias generating circuit responsive to the analog voltage generated for generating a first bias voltage; and
a first current generating circuit, coupled to the first bias generating circuit and responsive to the first bias voltage, for generating the at least two first currents.

16. The selective call receiver according to claim 15, wherein the first bias generating circuit comprises:
a resistor coupled between an input node for receiving the analog voltage generated and an intermediate node;
a bias transistor coupled between the intermediate node and the second supply voltage node and having a control electrode coupled to a first bias output node; and
an operational amplifier having a non-inverting input coupled to the intermediate node, having an inverting input coupled to a voltage reference, and having an output coupled to the first bias output node.

17. The selective call receiver according to claim 16, wherein the first current generating circuit comprises at least two current generating transistors, each coupled between a corresponding one of at least two summing nodes and the second supply voltage node, each transistor having a control electrode coupled to the first bias output node.

18. The selective call receiver according to claim 17, wherein the second current generating means further comprises a second bias generating circuit for generating a second bias voltage, and
wherein the at least two primary current generators and the at least one current correction generator are coupled to the second bias generating circuit and responsive to the second bias voltage, for generating the at least three second currents.

19. The selective call receiver according to claim 18, wherein the second bias generating circuit comprises:
a bias balancing transistor coupled between the first supply voltage node and a first intermediate node and having a control electrode coupled to the second supply voltage node;
a bias controlling transistor coupled between the first intermediate node and a second intermediate node and having a control electrode coupled to a second bias output node;
a resistor coupled between the second intermediate node and the second supply voltage node; and
an operational amplifier having a non-inverting input coupled to the second intermediate node, having an inverting input coupled to a voltage reference, and having an output coupled to the second bias output node.

20. The selective call receiver according to claim 19, wherein one of the at least two primary current generators comprises:
a current generating transistor, having control electrode coupled to the second bias output node, the current generating transistor being coupled between one of at least two balancing nodes and one of the at least two summing nodes, and the at least two summing nodes being coupled to at least two corresponding digital output nodes; and a current balancing transistor, coupled between one of the at least two balancing nodes and the first supply voltage node, and having control electrode coupled to the second supply voltage node, and wherein the at least one current correction generator comprises a current correction transistor, coupled between one of the at least two summing nodes and a switching node for the at least one current correction transistor, and having a control electrode coupled to the second bias output node.

21. The selective call receiver according to claim 20, wherein the switching means comprises at least one current correction switching transistor coupled between the switching node for the at least one current correction transistor and the first supply voltage node, and having a control electrode coupled to one of the at least two digital output nodes.

22. The selective call receiver according to claim 21, wherein the current generating transistor, the current balancing transistor, the current correction transistor, and the at least one current correction switching transistor, comprise a predetermined transconductance that determines the weighted incremental current levels for the summing nodes.

23. The selective call receiver according to claim 22, wherein the current generating transistor, the current balancing transistor, the current correction transistor, and the at least one current correction switching transistor, comprise a length and width of fabricated silicon, the length of which determines the transconductance thereof.

* * * * *